United States Patent [19]

Gavin

[11] 4,077,117

[45] Mar. 7, 1978

[54] HAND TOOL FOR INSERTING ELECTRICAL CONTACTS

[75] Inventor: John Henry Gavin, Lancaster, Pa.

[73] Assignee: E. I. Du Pont de Nemours and Company, Wilmington, Del.

[21] Appl. No.: 782,013

[22] Filed: Mar. 28, 1977

Related U.S. Application Data

[63] Continuation-in-part of Ser. No. 662,549, Mar. 1, 1976, abandoned.

[51] Int. Cl.² .............................................. H05K 3/32
[52] U.S. Cl. ..................................... 29/739; 29/626; 29/758; 29/811; 227/138; 227/149
[58] Field of Search ................. 29/739, 741, 758, 759, 29/626, 811; 227/138, 149, 114, 116

[56] References Cited

U.S. PATENT DOCUMENTS

| | | | |
|---|---|---|---|
| 2,088,761 | 8/1937 | Roberts | 227/149 |
| 2,783,468 | 3/1957 | Schwartz | 227/116 |
| 3,177,952 | 4/1965 | West | 29/739 X |
| 3,605,234 | 9/1971 | Bogursky | 29/747 X |
| 3,797,091 | 3/1974 | Gavin | 29/739 X |
| 3,816,895 | 6/1974 | Kuehn et al. | 227/149 |
| 3,960,191 | 6/1976 | Murray | 221/289 X |

Primary Examiner—Carl E. Hall

[57] ABSTRACT

Apparatus for severing electrical contacts from a carrier strip and loading the severed contacts into a hand tool which can then be used to insert the contacts individually into an apertured circuit element such as a printed circuit board.

5 Claims, 12 Drawing Figures

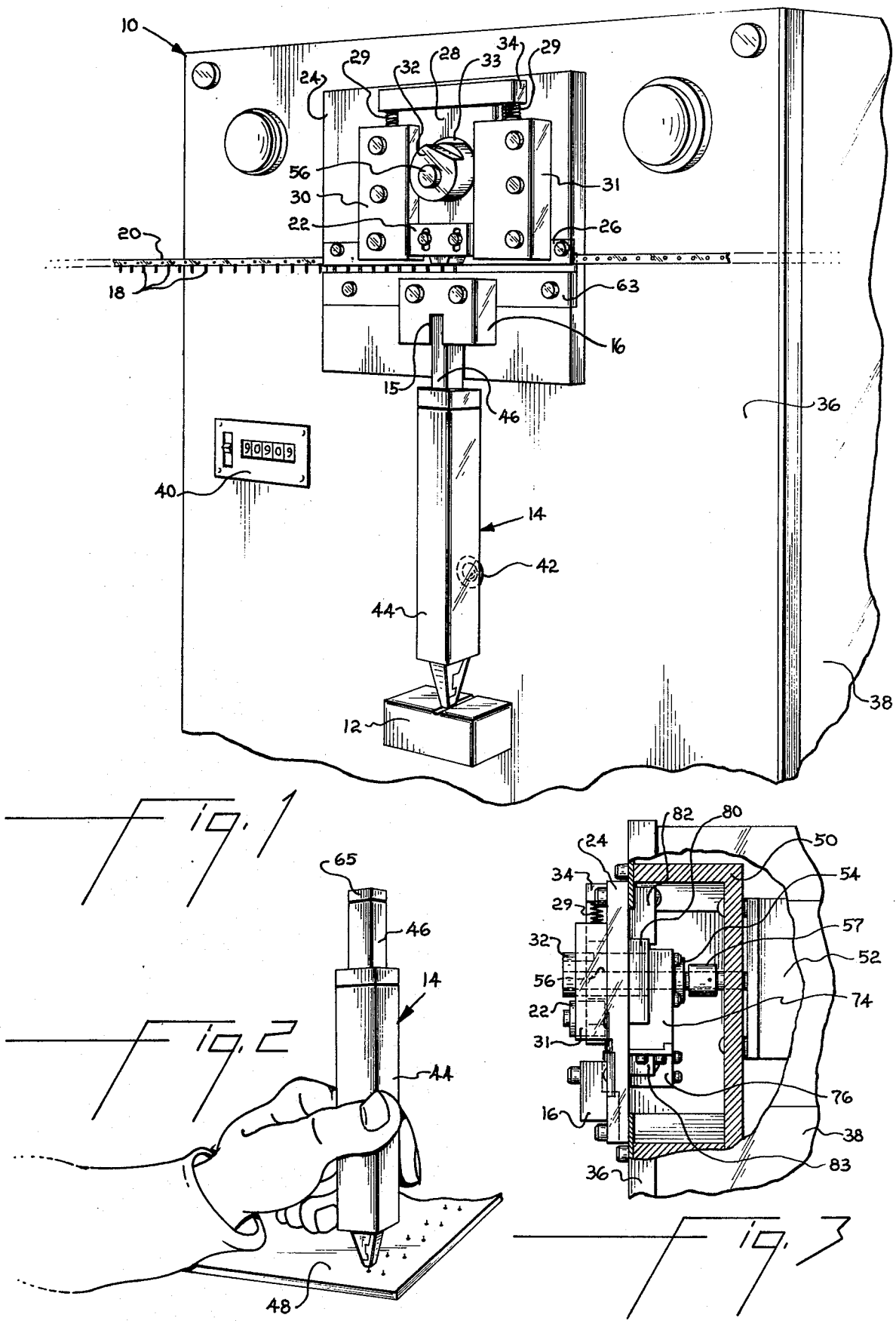

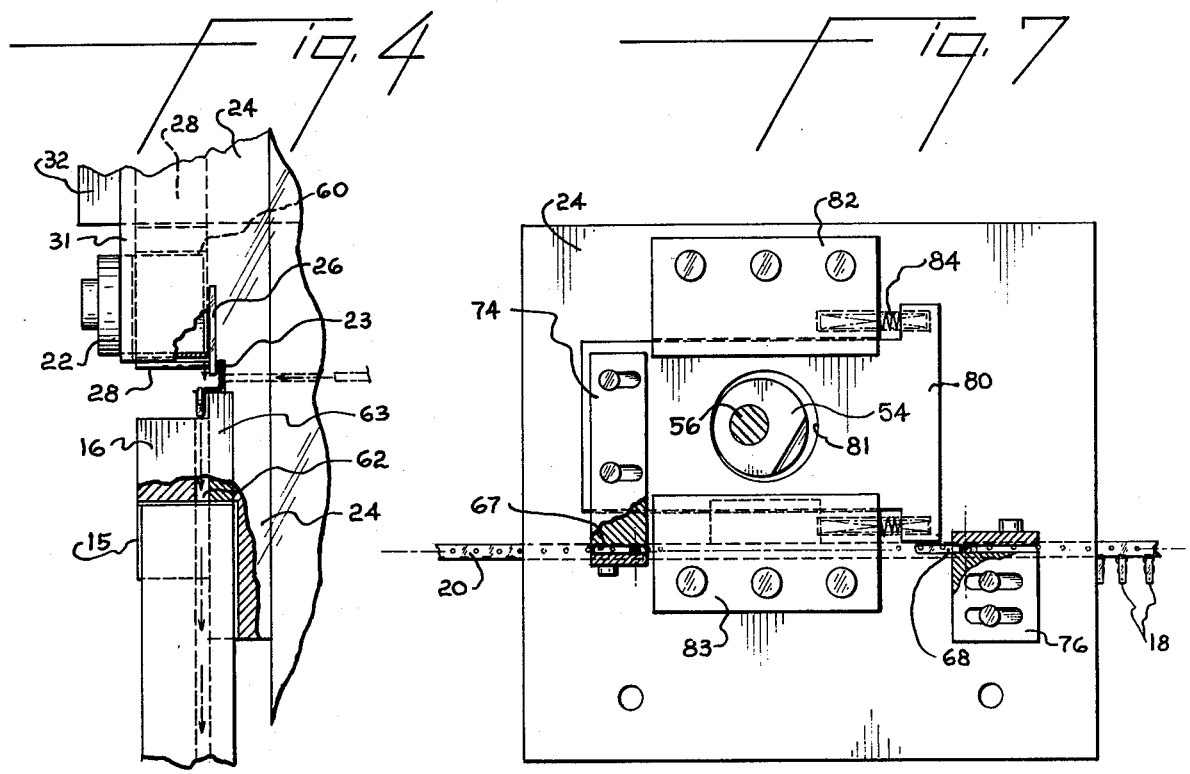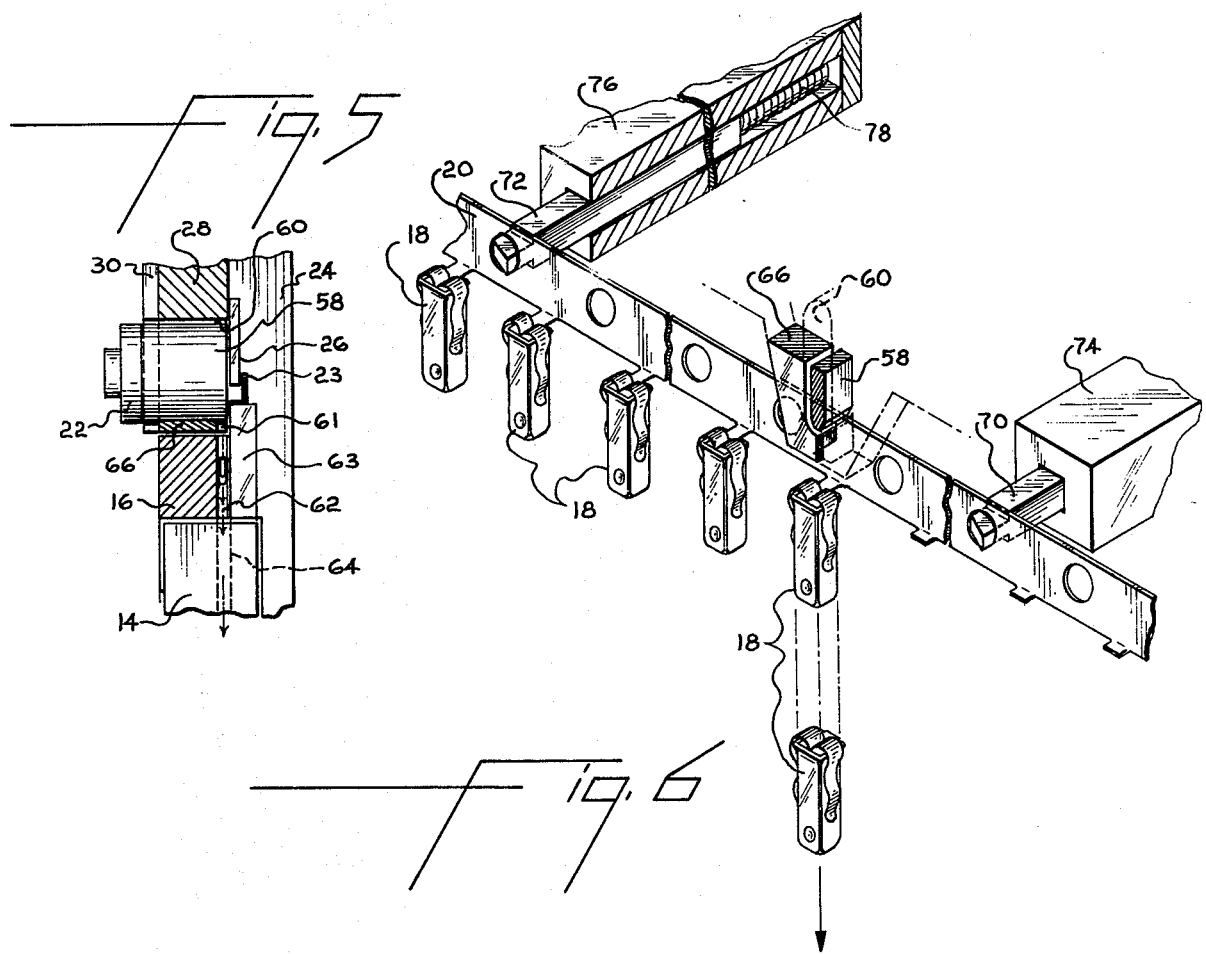

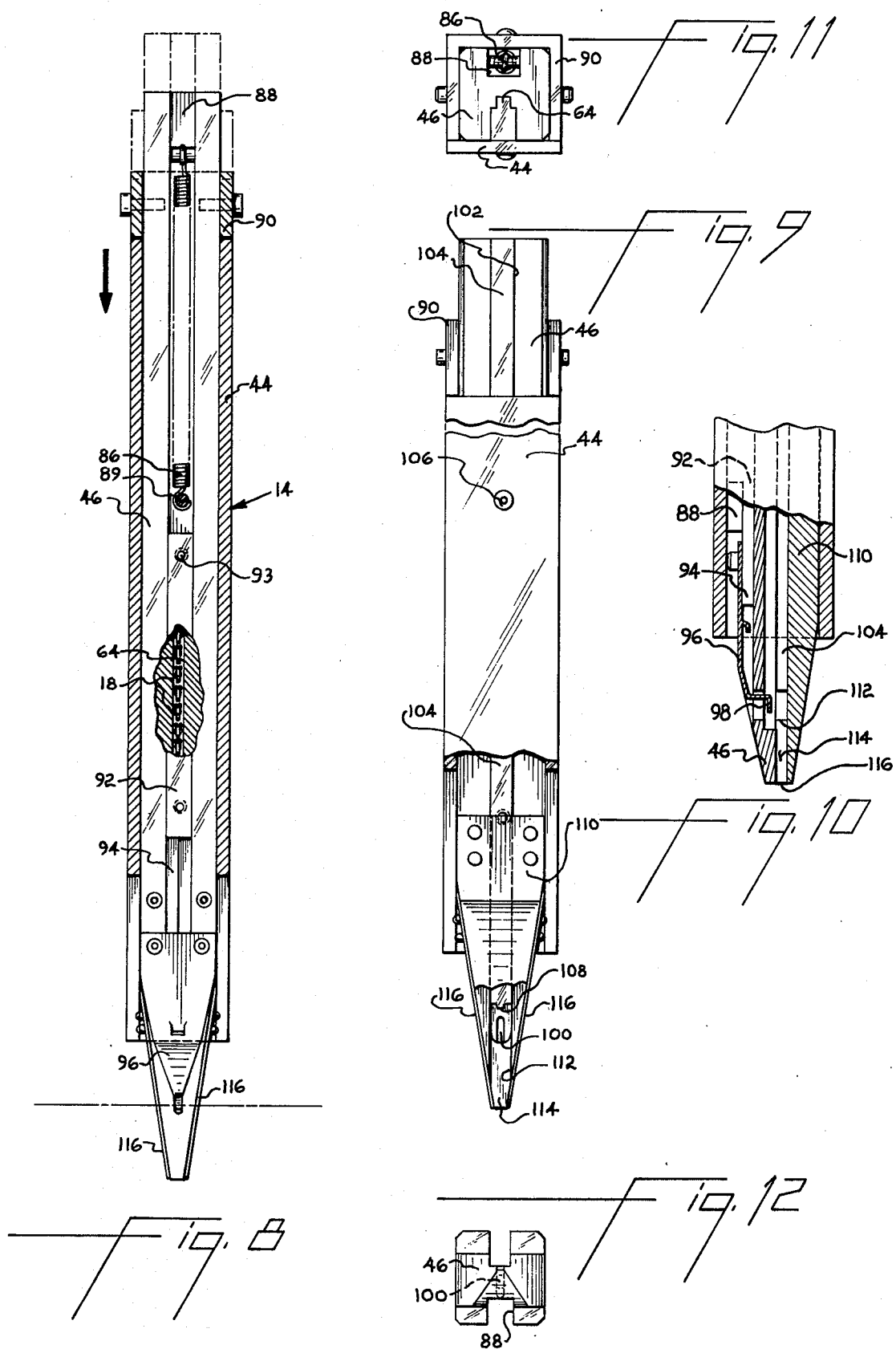

HAND TOOL FOR INSERTING ELECTRICAL CONTACTS

CROSS-REFERENCE TO RELATED APPLICATION

This is a continuation-in-part of my copending application Ser. No. 662,549, filed Mar. 1, 1976, now abandoned.

BACKGROUND

This disclosure relates, generally, to the insertion of contacts into apertured circuit elements and, more particularly, to a hand tool for inserting sockets into apertures in a circuit board. Additionally, the disclosure involves an apparatus for severing sockets from a carrier strip and loading them into the hand tool.

Complex, automated equipment for sequentially severing a socket from a carrier strip and inserting it into an apertured circuit board has been disclosed in U.S. Pat. No. 3,797,091 to Gavin. Such equipment is used at several locations where mass production of circuit boards with socketed apertures is required but is too expensive for other locations where circuit boards with the same sockets are fabricated only occasionally. A known hand tool for breadboarding and prototyping consists of a punch into one end of which a socket is fitted with tweezers.

SUMMARY

The hand tool disclosed and claimed herein has an actuator reciprocably mounted on an elongated body. In the body, there is a passage for a plurality of loose contacts and a restricted outlet through which individual contacts are ejected and inserted into apertures in a circuit element. A punch is connected to and reciprocates with the actuator. The punch has an end configuration adapted to engage and force successive contacts through the outlet.

The passage for contacts is loaded or filled on an apparatus which has a fixture for holding the hand tool with the passage located beneath a guide block provided with a channel into which loose contacts fall when served or cut from a carrier strip. Cam operated slides have parts for successively advancing the strip along a track and severing a contact.

DESCRIPTION OF THE DRAWINGS

Worthwhile objectives and advantages of the hand tool and loading apparatus will be apparent from the following specification wherein reference is made to the accompanying drawings in which:

FIG. 1 is a fragmentary perspective view of the loading apparatus and hand tool;

FIG. 2 shows how the tool is used to socket an aperture;

FIGS. 3, 4 and 5 are fragmentary side views of the apparatus shown in FIG. 1;

FIG. 6 is an enlarged, schematic illustration of the parts employed to advance a carrier strip and to sever individual sockets;

FIG. 7 is a rear view of operable parts shown in FIGS. 1, and 3-5;

FIG. 8 is a bottom view of the hand tool shown in FIGS. 1 and 2;

FIG. 9 is a top view of the hand tool; and FIGS. 10-12 are fragmentary side and end views of the hand tool.

In FIGS. 3-10, parts have been broken away and shown in section to reveal details of construction.

DESCRIPTION OF PREFERRED EMBODIMENTS

In the drawings, the loading apparatus chosen for purposes of illustration has been designated 10 and includes a fixture in the form of a grooved block 12 that supports one end of a hand tool 14. The other end of tool 14 fits within a recess 15 in a block 16. Block 16 has an internal channel through which sockets 18 fall to tool 14 after having been severed from a carrier strip 20 by a reciprocating cutter 22. Thus, tool 14 serves initially as a portable receptacle for severed sockets 18.

Strip 20 is advanced in a track defined by a recess 23 (FIG. 4) in a mounting plate 24 and by a track cover 26. Cutter 22 is adjustably fastened to a slide 28 that is reciprocated relative to slide guides 30,31 by a cam 32. The cam extends through a bore 33 in the slide. Bore 33 has a diameter slightly larger than that of cam 32. Slide 28 is biased upwardly by springs 29 located between guides 30,31 and a cap 34 attached to the slide.

Mounting plate 24 is attached to a door 36 on a metal box 38 and, as such, serves as a support for parts operable to sever and load sockets. On door 36, there is a counter 40 and also a detector switch 42 that inactivates apparatus 10 until a hand tool 14 or other receptacle for sockets has been positioned as illustrated.

Hand tool 14 has an actuating handle 44 telescoped on an elongated body 46. As shown in FIG. 2, tool 14 is positioned above an aperture in a printed circuit (PC) board 48. A socket 18 is ejected from the tool and inserted into the aperture by sliding actuator 44 downwardly on body 46.

Details of the mechanism for severing sockets 18 from a carrier strip 20 have been shown in FIGS. 3-5. A container 50 is attached to the inside of door 36 and serves as the mount for an electric motor 52 that is coupled to a feed cam 54 and also to cut-off cam 32. Cams 32,54 are mounted eccentrically on a cam shaft 56 coupled at 57 to motor 52 and have their high points displaced so that strip 20 can be fed and latched before descent of cutter 22. When the high point of cam 32 is above center, as in FIG. 1, springs 29 bias slide 28 and cutter 22 upwardly into engagement with the low point of the cam.

The parts operable to sever a socket are shown in the raised position in FIG. 4 and at the lower extent of a cut-off stroke in FIG. 5. Cutter 22 is T-shaped with a blade 58 extending through a slot 60 in slide 28. Beneath slot 60, slide 28 has an opening 61 above the internal channel 62 in guide block 16. As blade 58 descends toward a fixed cutting blade 63 (FIG. 5), a socket 18 is in opening 61 until severed from strip 20 and then falls directly through a channel 62 to a passage 64 in tool 14. As shown in FIG. 2, passage 64 can be closed by a plastic cover 65. Referring to FIGS. 1, 5 and 6, there is a tapered extension 66 on slide 28. Opening 61 is in the rear surface of extension 66, below slot 60.

The parts operable to feed and latch carrier strip 20 are best shown in FIGS. 6 and 7. Mounting plate 24 is slotted at 67,68 to clear the ends of feed and latch fingers 70,72 that engage perforations in strip 20. Fingers 70,72 ride in feed and latch housings 74,76 and are backed by springs 78. Feed housing 74 is attached to a feed slide 80 that has an oversized bore 81 for cam 54. Slide 80 fits beneath a pair of slide guides 82,83, is biased to the right (FIG. 7) by springs 84 and is moved to the left in a feed stroke by the high point on cam 54. During a feed stroke, the chamfered end of latch finger 72 cams out of a perforation and rides on strip 20 until the next perforation presents itself. Operational parts and relationships in hand tool 14 are shown in FIGS. 8–12 where it is seen that a spring 86 is fastened at one end to a pin that extends across a groove 88 in the bottom surface of body 46 and at its other end to actuating handle 44 at 89. Spring 86 holds handle 44 normally biased against a U-shaped stop 90 that is attached to body 46. As noted previously, handle 44 is slidably telescoped on elongated body 46. Below spring 86, a cam slide 92 rides in groove 88 and has one end attached at 93 to handle 44 for movement therewith. Slide 92 has an integral rod or extension 94 adapted to engage and cam a spring plate 96 when tool 14 is positioned over an aperture in PC board 48 and handle 44 is reciprocated in the direction indicated by the arrow in FIG. 8. Spring plate 96 is fastened to and bent to conform with a tapered end on the bottom side of inserter body 46. At its free end, spring plate 96 has a laterally extending latch 98 (FIG. 10) that normally extends through a port 100 into passage 64 and serves as a stop for sockets.

The top wall of inserter body 46 has a longitudinal channel 102 that serves as a track for an elongated punch 104 attached to handle 44 at 106. Punch 104 rides over passage 64 which terminates short of the outlet from tool 14. Passage 64 is in direct communication with channel 102 when the punch is in its retracted position. At its end, punch 104 has a protrusion 108 adapted to fit in the open end of a socket 18 located ahead of the punch. As explained hereinafter, a socket is moved to that location by latch 98.

Inserter body 46 also has tapered sides and a flat top wall at the end adapted for positioning on a PC board. More particularly, the top wall is recessed to receive a cover 110. The tapered side walls and channel 102 terminate at 112, leaving a space 114 bounded by the tapered tip of body 46, cover 110 and a pair of resilient, retainer plates 116 cut from a sheet of spring metal. At its tapered end, space 114 is of lesser dimensions than a socket 18 and thereby presents an outlet from hand tool 14 that is restricted by retainer plates 116.

In operation, passage 64 in hand tool 14 is first loaded with sockets 18. Alternatively, sockets can be loaded and shipped in tubular, plastic receptacles and transferred from such a receptacle to passage 64. Then, handle 44 is reciprocated relative to body 46 to locate a socket 18 in front of punch 104. As handle 44 moves downwardly, cam rod 94 engages spring plate 96 and moves latch 98 out of port 100, thus permitting the first socket 18 to fall to the end of passage 64. On the return stroke of handle 44, latch 98 on spring plate 96 returns to the position shown in FIG. 10 and moves the first socket into channel 102 whence it falls to space 114 and is retained by spring plates 116. When so readied, hand tool 14 can be positioned above an aperture in PC board 48. Upon actuation of handle 44, the socket ahead of punch 104 is ejected against the bias of retainer plates 116 and inserted. On the return stroke, latch 98 again positions the next socket 18 in front of punch 104.

Having thus described the invention, what is claimed as new and desired to be secured by Letters Patent is:

1. A hand tool comprising: an elongated body having a longitudinal passage therein for a plurality of discrete electrical contacts and an adjacent channel leading to a restricted outlet through which a contact is inserted into an apertured circuit element; an actuator reciprocably mounted on said body; and a punch slidably mounted in said channel and connected to the actuator for reciprocation therewith in an insertion stroke, said punch having an end configuration adapted to engage and force a contact through said outlet, said channel communicating with said passage for reception of another contact after each insertion stroke.

2. The hand tool of claim 1 further comprising a spring plate on said body adjacent the outlet, said spring plate having a latch normally extending into said passage and being coupled to said actuator for withdrawal of said latch during an insertion stroke, said latch then being in position to transfer another contact laterally to said channel as the actuator returns.

3. The hand tool of claim 2 wherein said body is provided with a groove in its surface and wherein is provided a cam member slidable in said groove, said cam member being coupled to the actuator for movement therewith into engagement with said spring plate during an insertion stroke.

4. The hand tool of claim 1 further comprising a pair of opposed, resilient retainer plates mounted on the body, extending toward said one end and thereby restricting said outlet, said punch being adapted to eject a contact through said outlet against the bias of said retainer plates.

5. The hand tool of claim 1 further comprising a spring connected at its ends to the body and the actuator for biasing the latter and said punch to a normal, withdrawn position.

* * * * *